(12) United States Patent
Huang (10) Patent No.: US 7,569,928 B2
(45) Date of Patent: Aug. 4, 2009

(54) ASSEMBLY STRUCTURE OF ELECTRONIC ELEMENT AND HEAT SINK

(75) Inventor: Chien-Hua Huang, Taoyuan Hsien (TW)

(73) Assignee: Delta Electronics, Inc., Taoyuan Hsien (TW)

( * ) Notice: Subject to any disclaimer, the term of this patent is extended or adjusted under 35 U.S.C. 154(b) by 164 days.

(21) Appl. No.: 11/287,022

(22) Filed: Nov. 23, 2005

(65) Prior Publication Data
US 2006/0121703 A1    Jun. 8, 2006

(30) Foreign Application Priority Data
Dec. 8, 2004    (TW) .............................. 93138002 A (51) Int. Cl.
*H01L 23/10* (2006.01)
(52) U.S. Cl. .................. 257/706; 257/707; 257/711; 257/713; 257/717; 257/718; 257/719; 257/E23.084; 257/E23.101
(58) Field of Classification Search ................ 257/276, 257/625, 675, 706, 707, 712–722, 726, 727, 257/796, E33.075, E31.131, E23.051, E23.08–E23.113
See application file for complete search history.

(56) References Cited

U.S. PATENT DOCUMENTS

| 3,641,474 A | * | 2/1972 | Owens | ..................... 439/78 |
| 3,801,874 A | * | 4/1974 | Stefani | ..................... 361/709 |
| 4,460,917 A | * | 7/1984 | Rogers | ..................... 257/717 |
| 5,592,021 A | * | 1/1997 | Meschter et al. | ............ 257/727 |

* cited by examiner

Primary Examiner—Jasmine J Clark (57) ABSTRACT

An assembly structure of an electronic element and a heat sink is disclosed. An assembly structure of an electronic element and a heat sink comprises a fastening element, an electronic element having a first through hole, and an insulating piece having a second through hole, an insulating element disposed in the first through hole of the electronic element and having a channel therein, and a heat sink. The second through hole is disposed correspondingly to the first through hole of the electronic element, the electronic element and the insulating piece are secured on the heat sink by inserting the fastening element through the channel of the insulating element, so as to insulate the electronic element from the heat sink by the insulating element.

19 Claims, 8 Drawing Sheets

ASSEMBLY STRUCTURE OF ELECTRONIC ELEMENT AND HEAT SINK

FIELD OF THE INVENTION

The present invention relates to an assembly structure of an electronic element and a heat sink, and more particularly to an assembly structure of an electronic element and a heat sink, wherein the electronic element is fastened on the heat sink.

BACKGROUND OF THE INVENTION

As the development of the computer industry and the tendency towards diversification of the electronic apparatus, the integration of the electronic elements on printed circuit board is increased, and the insulation and heat-dissipation issues of the electronic elements become more and more important. Particularly, the power transistor, which is commonly used in many control equipments, measuring devices, electric appliances and peripheral apparatuses, generates higher heat since it functions for signal processing and power driving and usually deals with high power signal, and thus, the insulation and heat-dissipation problems thereof need to be solved.

Figure 1:
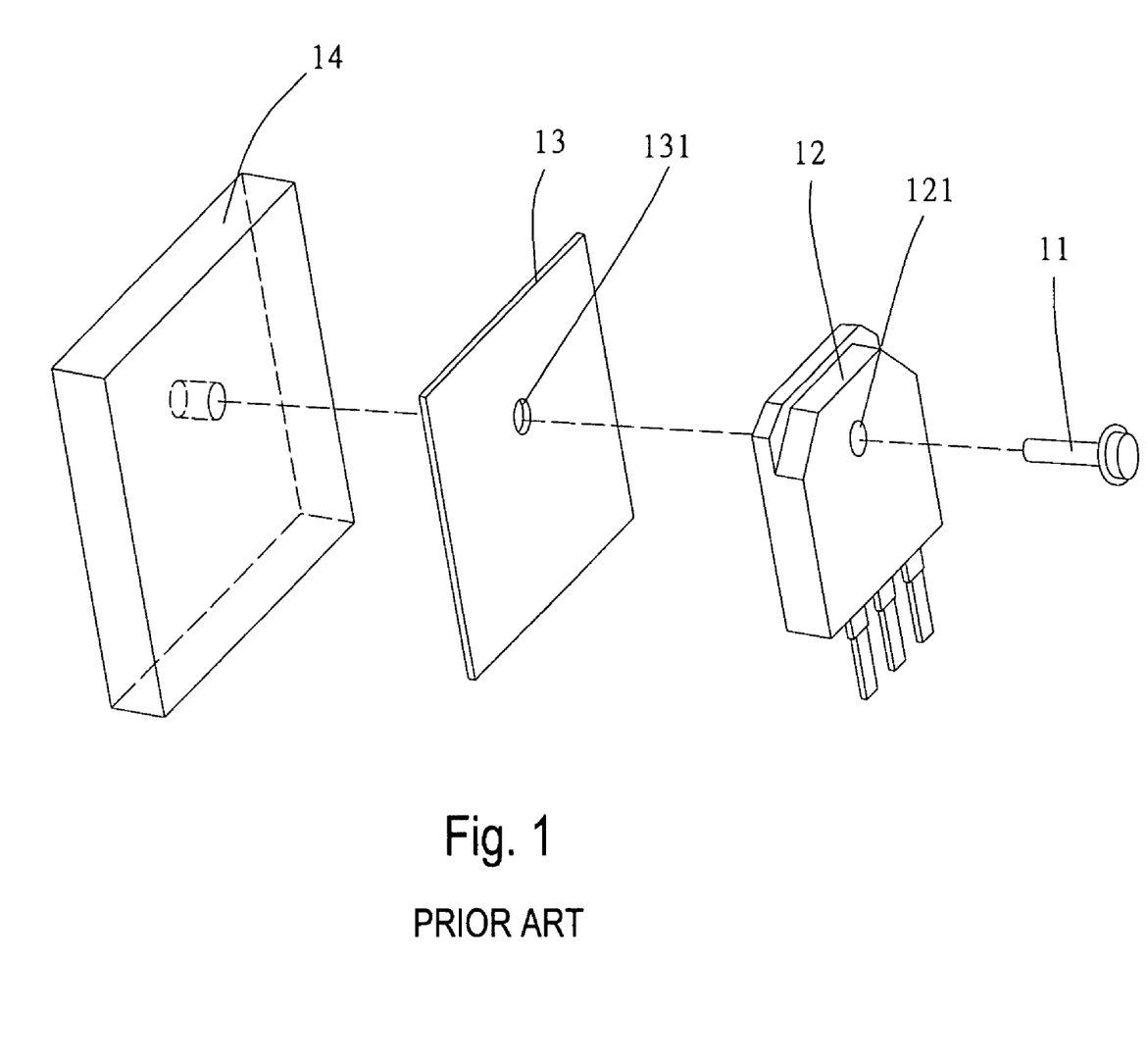
FIG. 1 is an exploded view showing a power transistor fastened on a heat sink according to the prior art.

In general, a power transistor is fastened on a heat sink to enhance the heat-dissipating effect thereof. Please refer to FIG. 1, which is an exploded view showing a conventional power transistor fastened on a heat sink. As shown in FIG. 1, a power transistor 12 is fastened on a heat sink 14 by a screw 11. In order to improve the insulating and heat-dissipating effect, an insulating piece 13 is disposed between the power transistor 12 and the heat sink 14, and the insulating piece 13 is coated with heat-dissipating paste on both sides. Due to the insulating piece 13 is usually made by a thin and plastic slice and the heat sink 14 is made by a conductive metal, the screw 11 may pierce or destroy the edge of the through hole 131 of the insulating piece 13 when the screw 11 is inserting through the through hole 131 of the insulating piece 13. Moreover, an ill-designed insulating piece 13 cannot provide enough insulating distance and further leads to electric arcs, sparks or smog resulted from a short circuit taken place between the power transistor 12 and the heat sink 14 when the power transistor 12 is operated under high voltage. However, as the operation power of the power transistor 12 is raised, the problem mentioned above will more seriously and indirectly affect the stability of the product assembly.

Therefore, it is needed to develop an assembly structure of an electronic element and a heat sink to solve the aforesaid problems and provide a more effective insulating and fastening apparatus to enhance the insulating and heat-dissipating effect.

SUMMARY OF THE INVENTION

It is an object of the present invention to provide an assembly structure of an electronic element and a heat sink to prevent the conduction between the power transistor and the heat sink via the screw when the power transistor is operated under high voltage, or to avoid the electric arcs, sparks or smog resulted from a short circuit taken place between the power transistor and the heat sink in the prior art.

In accordance with an aspect of the present invention, an assembly structure of an electronic element and a heat sink comprises a fastening element, an electronic element having a first through hole disposed correspondingly to the first through hole of the electronic element, an insulating piece having a second through hole, an insulating element disposed in the first through hole of the electronic element and having a channel therein and a heat sink. The electronic element and the insulating piece are secured on the heat sink by inserting the fastening element through the channel of the insulating element, so as to insulate the electronic element from the heat sink by the insulating element.

In an embodiment, the fastening element is a screw and further comprises a nut.

In an embodiment, the electronic element is a power transistor and the insulating element is a sleeve. Alternatively, the insulating element has a sleeve and a base, and the heat sink has an indentation for receiving the base of the insulating element.

In an embodiment, the assembly structure of the electronic element and the heat sink further comprises a heat-dissipating piece disposed between the insulating piece and the electronic element and having a third through hole, wherein the third through hole is disposed correspondingly to the first through hole of the electronic element.

Certainly, the area of the heat-dissipating piece is smaller than that of the insulating piece.

In an embodiment, the insulating element and the insulating piece are formed integrally, and the heat sink is disposed on a circuit board.

In accordance with another aspect of the present invention, an assembly structure of an electronic element and a heat sink comprises a fastening element, a heat sink, two electronic elements respectively disposed on both sides of the heat sink and having a first through hole, two insulating pieces respectively disposed between the heat sink and each of the electronic elements and having a second through hole disposed correspondingly to the first through hole of the electronic element, at least an insulating element disposed in the first through holes of the two electronic elements and having a channel therein. The two electronic elements and the two insulating pieces are secured on the heat sink by inserting the fastening element through the channel of the insulating element, so as to insulate the two electronic elements from the heat sink by the insulating element.

In an embodiment, the heat sink has a penetrating hole for receiving the base of the insulating element, and the length of the base of the insulating element is substantially equal to a thickness of the heat sink.

The above objects and advantages of the present invention will become more readily apparent to those ordinarily skilled in the art after reviewing the following detailed description and accompanying drawings, in which:

DETAILED DESCRIPTION OF THE PREFERRED EMBODIMENTS

The present invention will now be described more specifically with reference to the following embodiments. It is to be noted that the following descriptions of preferred embodiments of this invention are presented herein for purpose of illustration and description only; it is not intended to be exhaustive or to be limited to the precise form disclosed.

The present invention provides an assembly structure of an electronic element and a heat sink, and the following embodiments are illustrated with a power transistor to be secured on a heat sink with an insulating element. However, any other electronic elements that are applicable to the present techniques can be incorporated herein for reference.

Figure 2:
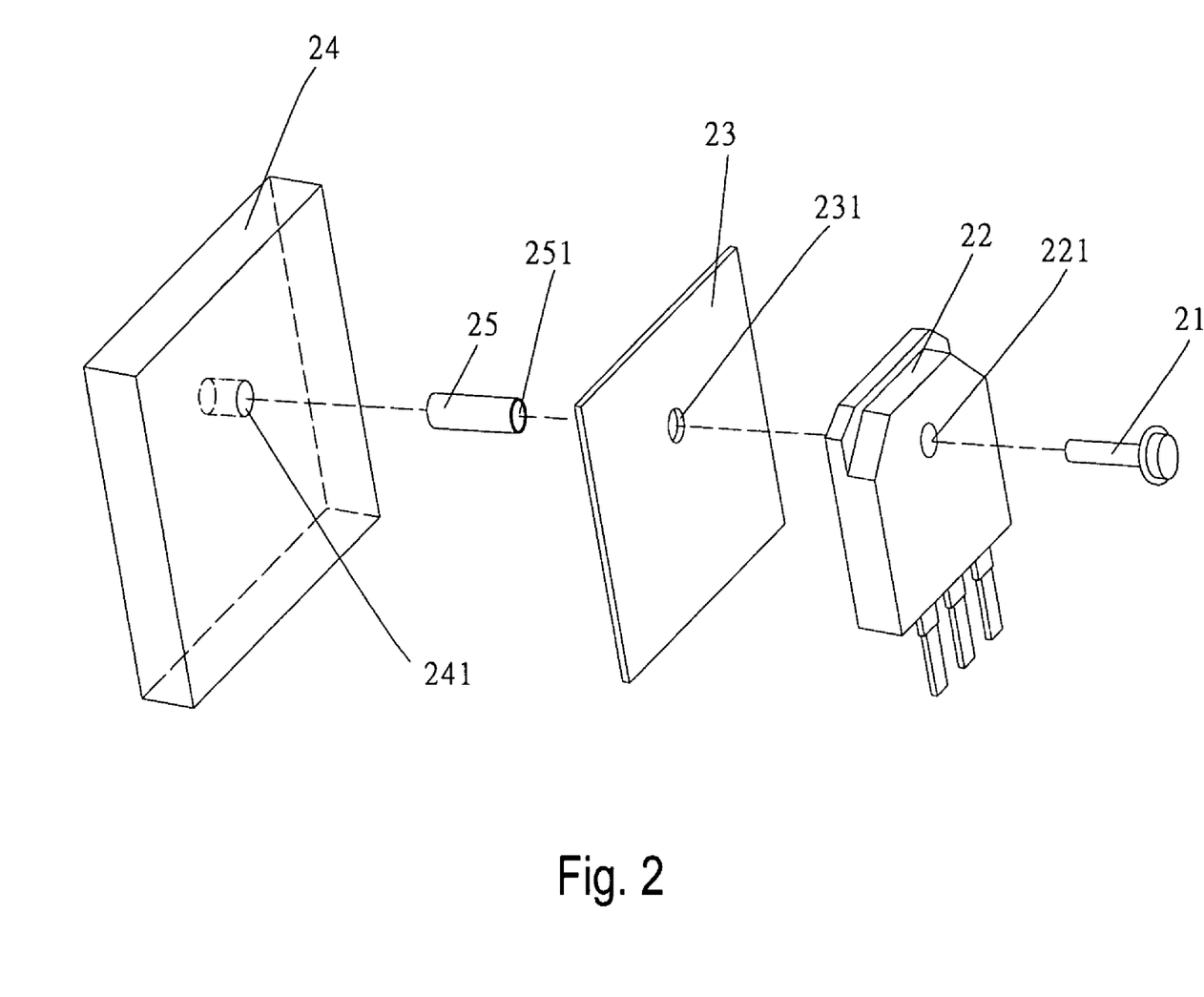
FIG. 2 is an exploded view showing the first preferred embodiment of the present invention.

Please refer to FIG. 2, which is an exploded view showing the first preferred embodiment of the present invention. As shown in FIG. 2, the assembly structure of the electronic element and the heat sink of the present invention comprises a fastening element 21, an electronic element 22, an insulating piece 23 (such as an insulating pad), a heat sink 24 and an insulating element 25, wherein the fastening element 21 can be a screw and/or be used with a nut (not shown). The electronic element 22 has a first through hole 221, the insulating piece 23 has a second through hole 231, and the insulating element 25 is disposed in the first through hole 221 of the electronic element 22 and has a channel 251 therein. In the embodiment, the insulating element 25 is a hollow sleeve and is not only disposed in the first through hole 221 of the electronic element 22 but also passing through the second through hole 231 of the insulating piece 23 to allow the electronic element 22 and the insulating piece 23 to be secured sequentially on the heat sink 24 by inserting the fastening element 21 through the channel 251 of the insulating element 25, so as to insulate the electronic element 22 from the heat sink 24 by the insulating element 25.

Accordingly, even though the electronic element 22 is operated under high voltage, the electronic element 22 can still be insulated from the heat sink 22 to avoid the defects of electric arcs, sparks or smog in the prior art. Besides, in the embodiment, the heat sink 24 has a through hole 241 or an indentation. The through hole 241 of the heat sink 24 shown in FIG. 2 can be used to secure the electronic element 22 thereon by the fastening element 21 cooperating with the nut (not shown). Alternatively, the heat sink 24 can be provided with an indention (not shown) engaging with one end of the insulating element 25, and the fastening element 21 can be further secured on the heat sink 24 by tapping, which can save the use of the nut.

Figure 3:
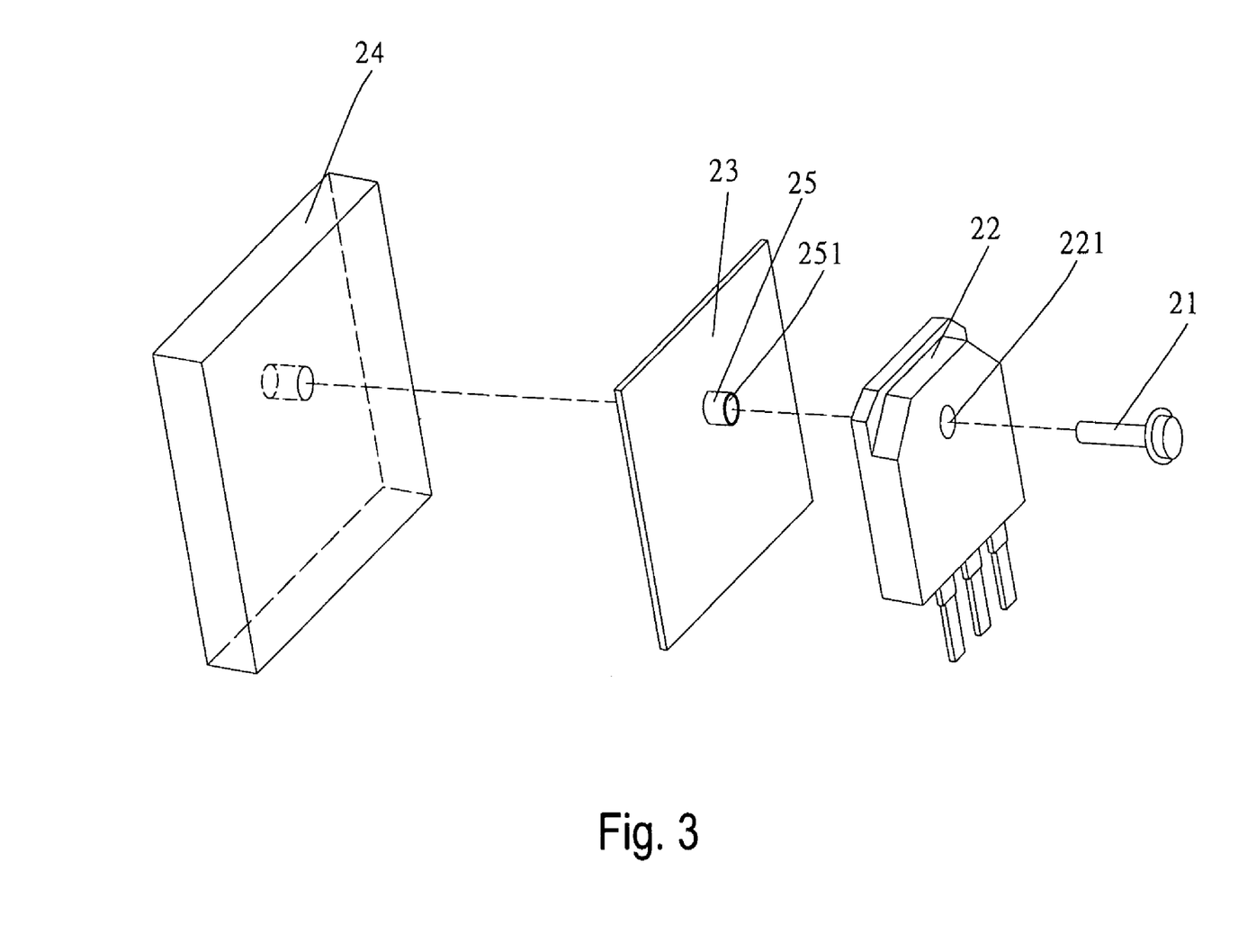
FIG. 3 is an exploded view showing the second preferred embodiment of the present invention.

In another embodiment, the insulating element 25 can be formed integrally with the insulating piece 23. Please refer to FIG. 3, which is an exploded view showing the second preferred embodiment of the present invention. In the embodiment, the insulating element 25 extends from the rim of the second through hole 231 of the insulating piece 23 or is formed with the lengthened sleeve of the insulating piece 23. The insulating element 25 can also be disposed in the first through hole 221 of the electronic element 22, and the fastening element 21 is able to secure the electronic element 22 on the heat sink 24 by inserting through the channel 251 of the insulating element 25. The embodiment not only increases the insulating distance but also efficiently insulates the electronic element 22 against the heat sink 24 by the insulating piece 23 and the insulating element 25.

Figure 4A:
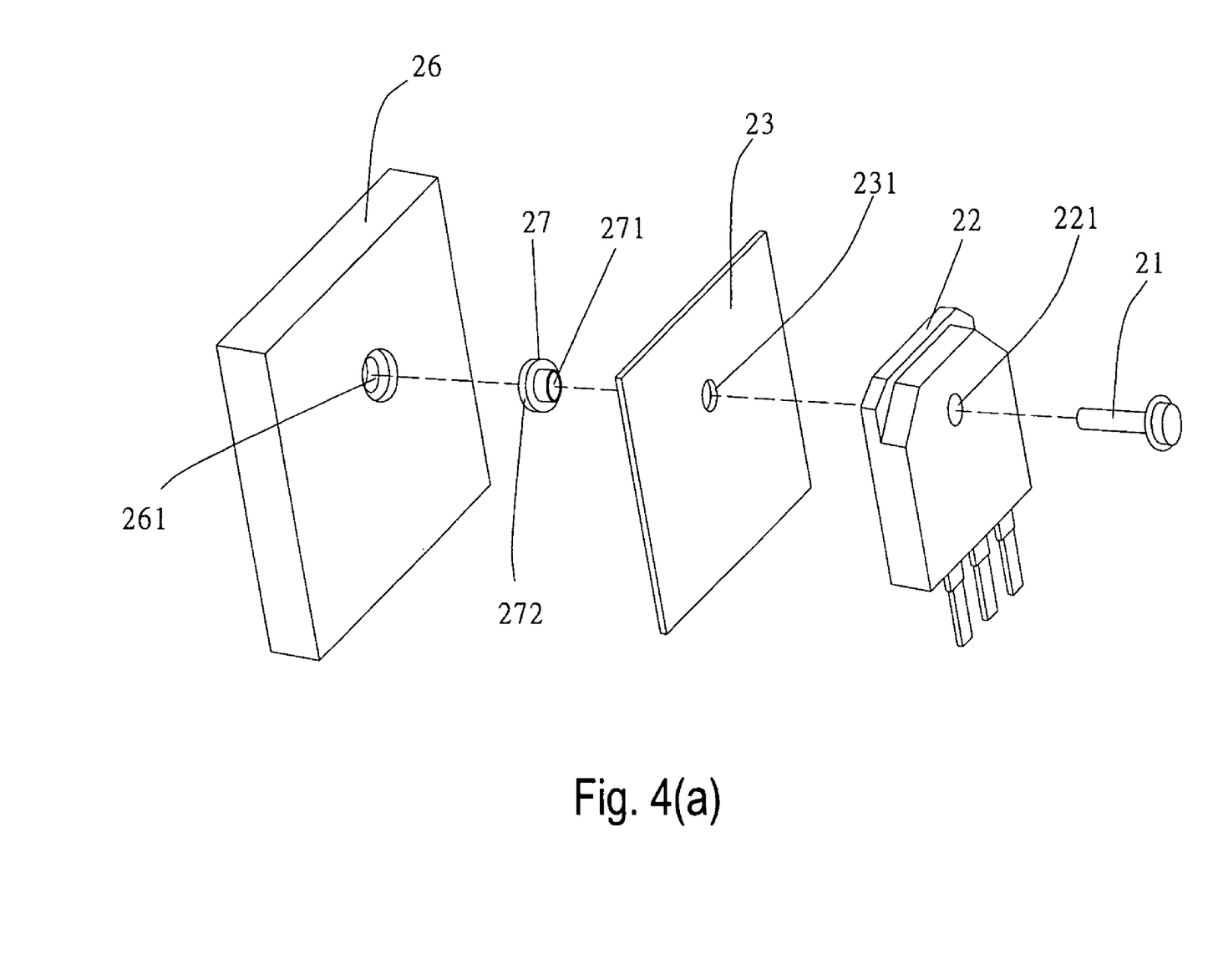
FIG. 4(a) is an exploded view showing the third preferred embodiment of the present invention.
Figure 4B:
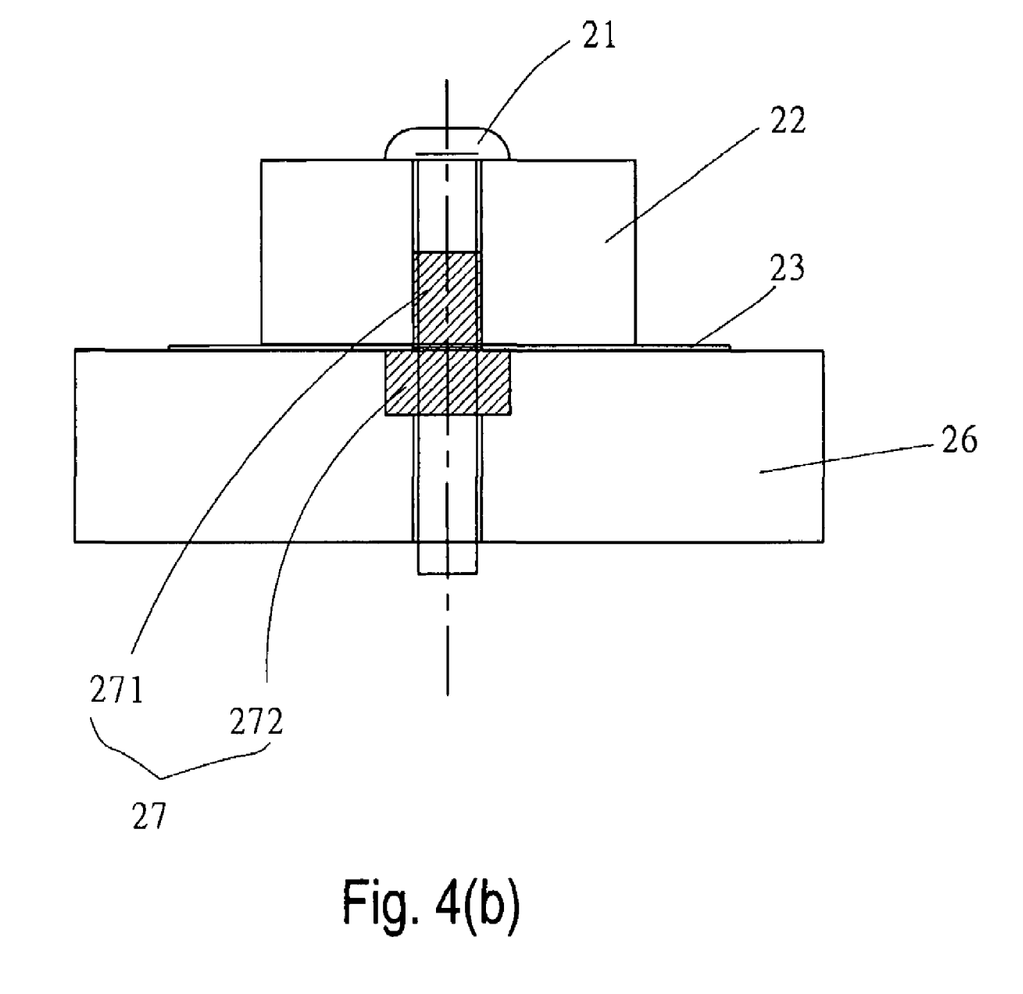
FIG. 4(b) is a cross-sectional view of the third preferred embodiment shown in FIG. 4(a)

Please further refer to FIGS. 4(a) and 4(b), wherein FIG. 4(a) is an exploded view showing the third preferred embodiment of the present invention, and FIG. 4(b) is a cross-sectional view of the third preferred embodiment shown in FIG. 4(a) of the present invention. As shown in FIG. 4(a), in the embodiment, the insulating element 27 comprises a sleeve 271 and a base 272 and forms a channel inside the sleeve 271 and the base 272. The sleeve 271 of the insulating element 27 is disposed inside the first through hole 221 of the electronic element 22 and the second through hole 231 of the insulating piece 23. Besides, the heat sink 26 comprises an indentation 261 for receiving the base 272 of the insulating element 27. As shown in FIG. 4(b), the fastening element 21 is able to secure the electronic element 22 and the insulating piece 23 on the heat sink 26 by the channel of the insulating element 27 to insulate the electronic element 22 against the heat sink 26 by the insulating element 27. The design improves the insulating effect between the electronic element 22 and the heat sink 26 and thus prevents the electronic element 22 and the heat sink 26 from electric arcs, sparks or smog.

Figure 5:
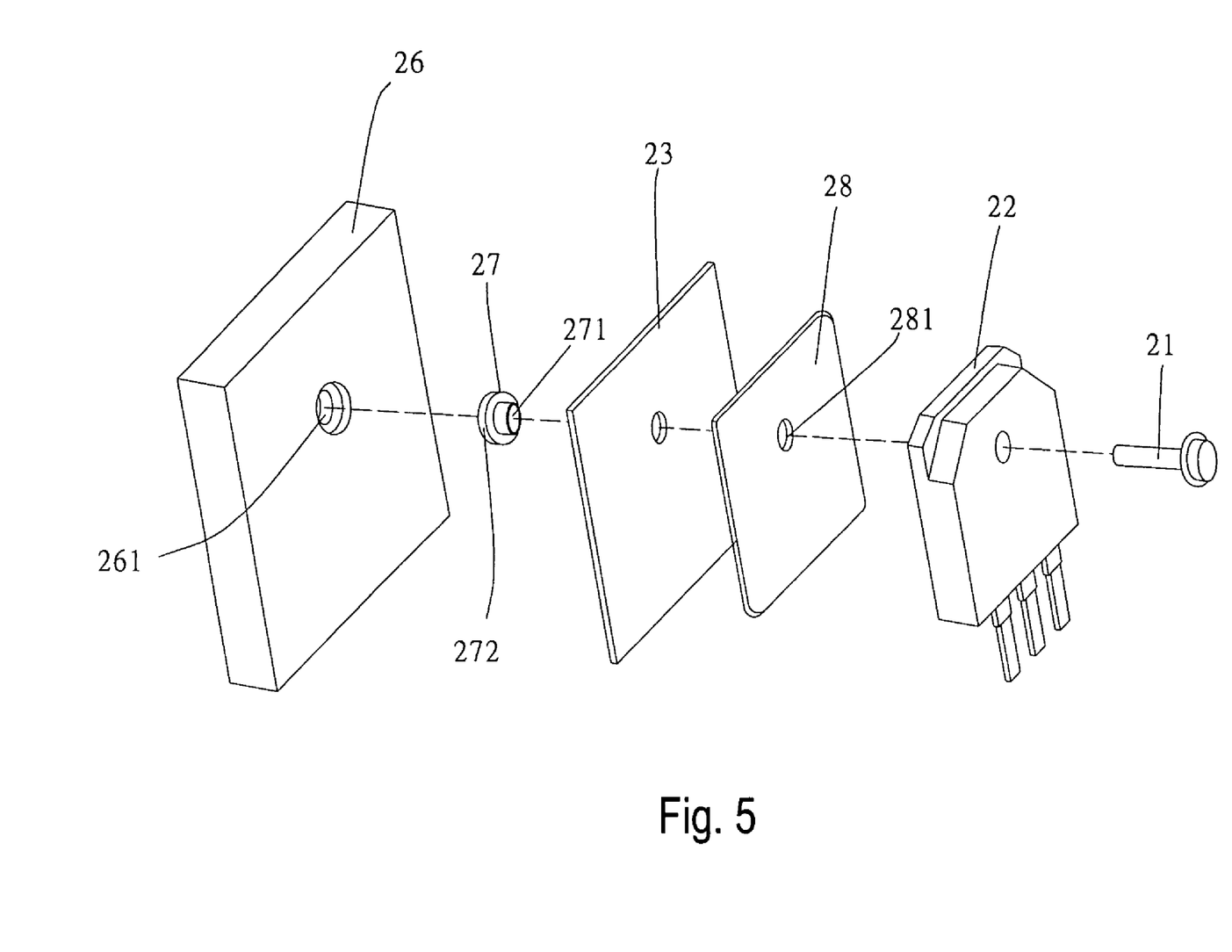
FIG. 5 is an exploded view showing the fourth preferred embodiment of the present invention.

In order to improve the heat-dissipating effect of the present invention, the assembly structure of the electronic element and the heat sink further comprises a heat-dissipating piece. Please refer to FIG. 5, which is an exploded view showing the fourth preferred embodiment of the present invention. As shown in FIG. 5, the assembly structure of the electronic element and the heat sink of the present invention further comprises a heat-dissipating piece 28 disposed between the insulating piece 23 and the electronic element 22, wherein the heat-dissipating piece 28 has a third through hole 281 disposed correspondingly to the first through hole 221 of the electronic element 22 for the sleeve 271 to pass therethrough. In the embodiment, the disposition of the heat-dissipating piece 28 can increase the conductive area of the electronic element 22, so the heat generated by the electronic element 22 can be conducted to the heat sink 26 more quickly via the heat-dissipating piece 28, which increases the heat-dissipating effect of the electronic element 22. However, in order to ensure that it is not conductive between the heat-dissipating piece 28 and the heat sink 26, the area of the heat-dissipating piece 28 should be smaller than that of the insulating piece 23 to keep the insulation between the heat-dissipating piece 28 and the heat sink 26 insulating in the embodiment.

Figure 6:
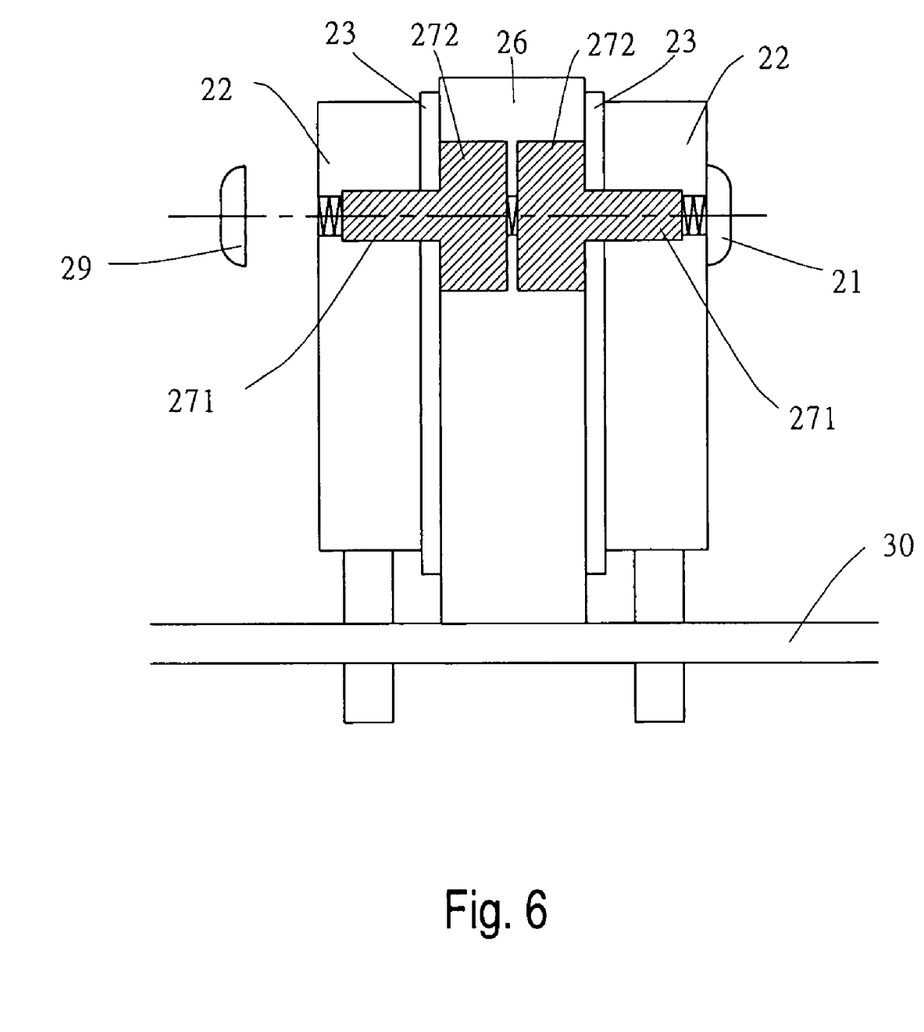
FIG. 6 is a cross-sectional view showing the fifth preferred embodiment of the present invention.

Besides, the assembly structure of the electronic element and the heat sink of the present invention can further fasten two electronic elements oppositely. Please further refer to FIG. 6, which is a cross-sectional view showing the fifth preferred embodiment of the present invention. As shown in FIG. 6, the assembly structure of the electronic element and the heat sink of the present invention comprises a fastening element 21, two electronic elements 22, two insulating pieces 23, a heat sink 26 and two insulating elements 27. The two electronic elements 22 are disposed on the opposite sides of the heat sink 26, the two insulating pieces 23 are respectively disposed between the two electronic elements 22 and the heat sink 26, and the two insulating elements 27 are respectively disposed on the opposite sides of the heat sink 26 to insulate the electronic elements 22 from the heat sink 26. In the embodiment, each insulating element 27 has a sleeve 271 and a base 272 and forms a channel inside the sleeve 271 and the base 272. The sleeve 271 of the insulating element 27 is disposed inside the first through hole 221 of the electronic element 22 and the second through hole 231 of the insulating piece 23, and the fastening element 21 is able to secure the two electronic elements 22 on the heat sink 24 by inserting through the channels 271 of the insulating elements 27. Thereby, the two electronic elements 22 are insulated from the heat sink 26 by the two insulating elements 27. In addition, such design is able to dispose more electronic elements on the same area to fully utilize the space of the heat sink 26. Certainly, the fastening element 21 can be used with the nut 29 to make the assembly more stable in the embodiment. Besides, after the electronic elements 22 are secured on the heat sink 26, the heat sink 26 and the electronic elements 22 can be further secured on the circuit board 30 in the embodiment as shown in FIG. 6.

Figure 7:
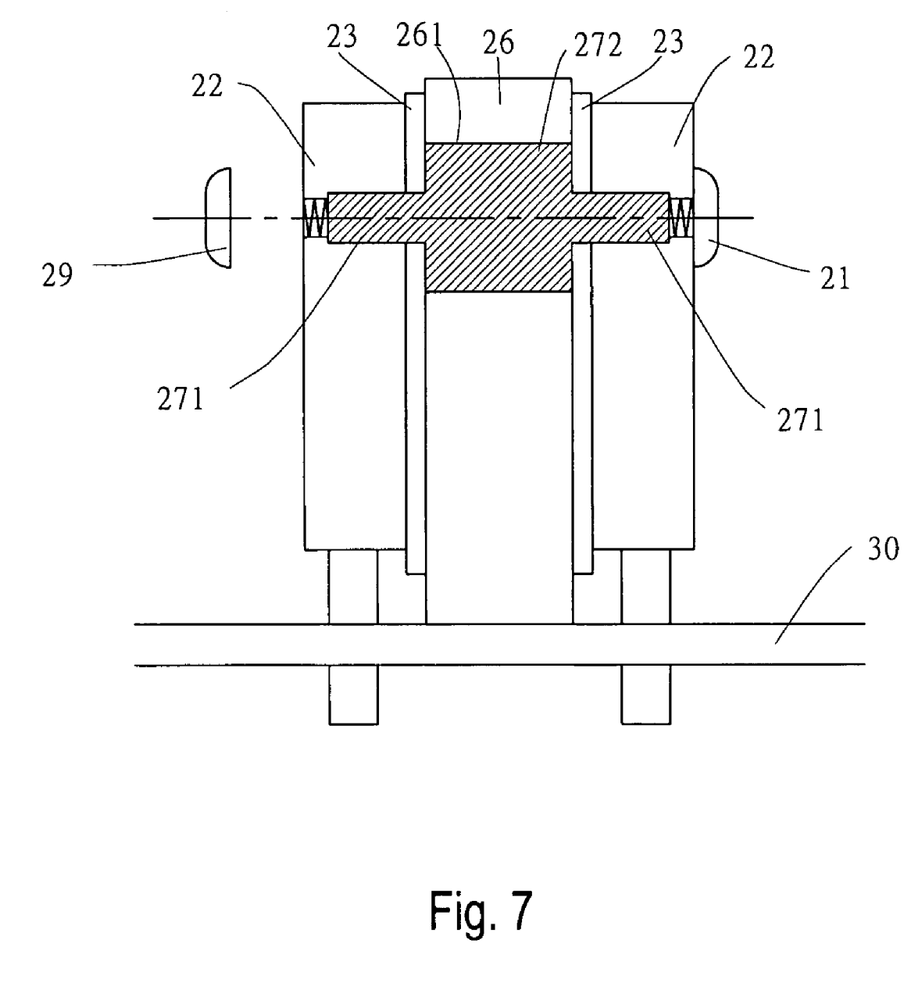
FIG. 7 is a cross-sectional view showing the sixth preferred embodiment of the present invention.

Please refer to FIG. 7, which is a cross-sectional view showing the sixth preferred embodiment of the present invention. As shown in FIG. 7, the assembly structure of the electronic element and the heat sink of the present invention comprises a fastening element 21, two electronic elements 22, two insulating piece 23, a heat sink 26 and an insulating element 27. The two electronic elements 22 are respectively disposed on the opposite sides of the heat sink 26, and the two insulating piece 23 are respectively disposed between the two electronic elements 22 and the heat sink 26. The heat sink comprises a penetrating hole 261, and the insulating element 27 comprises two sleeves 271 and a base 272, wherein the sleeves 271 extend from the opposite sides of the base 272. The thickness of the base 272 can be equal to or slightly smaller than that of the heat sink 26 to dispose the base 272 of the insulating element 27 in the penetrating hole 261 of the heat sink 26. The sleeves 271 and the base 272 further comprise a channel (not shown) therein, and each of the sleeves 271 of the insulating element 27 is disposed both in the first through hole 221 of each of the electronic elements 22 and the second through hole 231 of each of the insulating pieces 23. The fastening element 21 secures the two electronic elements 22 on the opposite sides of the heat sink 26 by inserting through the channel of the insulating element 27, and the two electronic elements 22 are insulated from the heat sink 26 by the insulating element 27. In addition, such design is able to dispose more electronic elements on the same area to fully utilize the space of the heat sink 26. Certainly, the fastening element 21 can be used with the nut 29 to make the assembly more stable in the embodiment. The penetrating hole 261 of the heat sink 26 not only provides the securing and insulating effects but also decreases the working-hour on disposing two insulating elements on each side, so as to reduce the cost.

From the above descriptions, the assembly structure of the electronic element and the heat sink of the present invention insulates the electronic element from the heat sink mainly by the insulating element and secures all the elements by the fastening element to increase the insulating distance between the electronic element and the heat sink, so that the electronic element and the heat sink cannot be conducted to avoid the occurrence of electric arcs, sparks or smog. Moreover, the assembly structure of the present invention secures the electronic element on the heat sink stably, and can further improve the space utilization rate. Therefore, the present invention possesses high industrial value.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims, which are to be accorded with the broadest interpretation so as to encompass all such modifications and similar structures.

What is claimed is:

1. An assembly structure of an electronic element and a heat sink, comprising:
    a fastening element;
    an electronic element having a first through hole; and
    an insulating piece having a second through hole, wherein said second through hole is disposed correspondingly to said first through hole of said electronic element;
    a heat sink disposed on a circuit board; and
    an insulating element disposed in said first through hole of said electronic element and having a channel therein, said insulating element being partially received in said heat sink;
    wherein said electronic element and said insulating piece are secured on said heat sink by inserting said fastening element through said channel of said insulating element, so as to insulate said electronic element from said heat sink by said insulating element.

2. The assembly structure of the electronic element and the heat sink according to claim 1 wherein said fastening element is a screw.

3. The assembly structure of the electronic element and the heat sink according to claim 2 wherein said fastening element further comprises a nut.

4. The assembly structure of the electronic element and the heat sink according to claim 1 wherein said electronic element is a power transistor.

5. The assembly structure of the electronic element and the heat sink according to claim 1 wherein said insulating element is a sleeve.

6. The assembly structure of the electronic element and the heat sink according to claim 1 wherein said insulating element has a sleeve and a base.

7. The assembly structure of the electronic element and the heat sink according to claim 6 wherein said heat sink has an indentation for receiving said base of said insulating element.

8. The assembly structure of the electronic element and the heat sink according to claim 1 further comprising a heat-dissipating piece disposed between said insulating piece and said electronic element and having a third through hole, wherein said third through hole is disposed correspondingly to said first through hole of said electronic element.

9. The assembly structure of the electronic element and the heat sink according to claim 8 wherein an area of said heat-dissipating piece is smaller than that of said insulating piece.

10. An assembly structure of an electronic element and a heat sink, comprising:
    a fastening element;
    a heat sink;
    two electronic elements respectively disposed on both sides of said heat sink and having a first through hole; and
    two insulating pieces respectively disposed between said heat sink and each of said electronic elements and having a second through hole, wherein said second through hole is disposed correspondingly to said first through hole of said electronic element; and
    at least an insulating element disposed in said first through holes of said two electronic elements and having a channel therein;
    wherein said two electronic elements and said two insulating pieces are secured on said heat sink by inserting said fastening element through said channel of said insulating element, so as to insulate said two electronic elements from said heat sink by said insulating element.

11. The assembly structure of the electronic element and the heat sink according to claim 10 wherein said fastening element is a screw.

12. The assembly structure of the electronic element and the heat sink according to claim 11 wherein said fastening element further comprises a nut.

13. The assembly structure of the electronic element and the heat sink according to claim 10 wherein said electronic element is a power transistor.

14. The assembly structure of the electronic element and the heat sink according to claim 10 wherein said insulating element is a sleeve.

15. The assembly structure of the electronic element and the heat sink according to claim 10 wherein said insulating element has a sleeve and a base.

16. The assembly structure of the electronic element and the heat sink according to claim 15 wherein said heat sink has a penetrating hole for receiving said base of said insulating element.

17. The assembly structure of the electronic element and the heat sink according to claim 16 wherein a length of said base of said insulating element is substantially equal to a thickness of said heat sink.

18. The assembly structure of the electronic element and the heat sink according to claim 10 wherein said heat sink is disposed on a circuit board.

19. An assembly structure of an electronic element and a heat sink, comprising:
   a fastening element;
   an electronic element having a first through hole; and
   an insulating piece having a second through hole, wherein said second through hole is disposed correspondingly to said first through hole of said electronic element;
   an insulating element disposed in said first through hole of said electronic element and having a channel therein, said insulating element and said insulating piece being formed integrally; and
   a heat sink disposed on a circuit board;
   wherein said electronic element and said insulating piece are secured on said heat sink by inserting said fastening element through said channel of said insulating element, so as to insulate said electronic element from said heat sink by said insulating element.

* * * * *